US007702956B2

(12) United States Patent
Pyo

(10) Patent No.: US 7,702,956 B2
(45) Date of Patent: Apr. 20, 2010

(54) CIRCUIT FOR TRANSFERRING TEST FLAG SIGNALS AMONG MULTIPLE PROCESSORS, THE TEST FLAG SIGNALS BEING USED BY A TEST CONTROLLER TO GENERATE TEST SIGNALS

(75) Inventor: Jung-Yul Pyo, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 542 days.

(21) Appl. No.: 11/623,831

(22) Filed: Jan. 17, 2007

(65) Prior Publication Data

US 2007/0226573 A1  Sep. 27, 2007

(30) Foreign Application Priority Data

Feb. 8, 2006  (KR) .................... 10-2006-0012192

(51) Int. Cl.
*G06F 11/00* (2006.01)
*G06F 11/26* (2006.01)

(52) U.S. Cl. .............................. 714/31; 714/30; 714/27
(58) Field of Classification Search ................... 714/30, 714/27, 31
See application file for complete search history.

(56) References Cited

U.S. PATENT DOCUMENTS

| 5,680,544 | A  | * | 10/1997 | Edmondson et al. ........... 714/42 |
| 5,781,721 | A  |   | 7/1998  | Hayes et al. |
| 5,978,937 | A  | * | 11/1999 | Miyamori et al. ............. 714/45 |
| 6,446,221 | B1 | * | 9/2002  | Jaggar et al. .................. 714/30 |
| 6,665,816 | B1 | * | 12/2003 | Edwards et al. ............... 714/30 |
| 6,865,663 | B2 | * | 3/2005  | Barry ........................... 712/34 |
| 7,080,283 | B1 | * | 7/2006  | Songer et al. ................. 714/30 |
| 7,231,551 | B1 | * | 6/2007  | Treue et al. ................... 714/30 |
| 2005/0149693 | A1 | * | 7/2005 | Barry ........................... 712/34 |
| 2006/0150023 | A1 | * | 7/2006 | Hasebe et al. ................ 714/38 |

FOREIGN PATENT DOCUMENTS

| JP | 06-095966 | 4/1994 |
| JP | 08-077069 | 3/1996 |
| JP | 11-327949 | 11/1999 |
| KR | 10-0267110 | 7/2000 |

OTHER PUBLICATIONS

Wikipedia's ARM Architecture version from Jan. 25, 2006 http://en.wikipedia.org/w/index.php?title=ARM_architecture&oldid=36700463.*

* cited by examiner

*Primary Examiner*—Joshua A Lohn
*Assistant Examiner*—Joseph Schell
(74) *Attorney, Agent, or Firm*—F. Chau & Associates, LLC

(57) ABSTRACT

A system on chip processor, that is, a semiconductor integrated circuit in which a processor, a cache memory and the like are integrated into one chip, includes a test controller, and a trace memory. The test controller generates test control signals in response to test flag signals generated from a processor. The trace memory stores a transmission data signal between the processor and a cache memory, a device under test, in response to the test control signals. Since the trace memory is provided within the integrated circuit, an operation of the device under test, which is configured in the integrated circuit, can be tested without disassembling the integrated circuit even after the integrated circuit is completely manufactured.

23 Claims, 6 Drawing Sheets

US 7,702,956 B2

CIRCUIT FOR TRANSFERRING TEST FLAG SIGNALS AMONG MULTIPLE PROCESSORS, THE TEST FLAG SIGNALS BEING USED BY A TEST CONTROLLER TO GENERATE TEST SIGNALS

CROSS-REFERENCE TO RELATED APPLICATION

This U.S. non-provisional patent application claims priority under 35 U.S.C. §119 of Korean Patent Application No. 2006-12192, filed on Feb. 8, 2006, the entire contents of which are hereby incorporated by reference.

BACKGROUND OF THE INVENTION

The present disclosure relates to a system on a chip (SOC).

As semiconductor processes become more highly developed, a semiconductor integrated circuit is being developed into a system-on-chip (SOC) type in which a central processing unit (CPU), a cache memory, an input/output interface circuit, and the like are integrated into a single chip. When the CPU and the cache memory are integrated into a single chip, a data input/output speed is improved and, therefore, the entire performance of the CPU may be improved. The imbalance of a manufacturing process, however, may cause defects in the semiconductor integrated circuit. In this case, efforts to find out what causes such defects are required.

In general, a semiconductor integrated circuit is manufactured through a plurality of processes, and a defect of an integrated circuit is tested for in every process. In order to find out a cause of a defect generated after the circuit is completely manufactured into the SOC, a process of applying a test signal to the semiconductor integrated circuit after disassembling the integrated circuit, and then probing signals transferred through exposed signal lines should be performed. This kind of a test method, however, undesirably consumes a lot of time, and requires the close attention of an operator.

SUMMARY OF THE INVENTION

Exemplary embodiments of the present invention provide a semiconductor integrated circuit that can be easily tested.

Exemplary embodiments of the present invention provide semiconductor integrated circuits including: a device under test; a processor accessing the device under test, and generating test flag signals; a test controller generating test control signals in response to the test flag signals; and a trace memory storing a transmission data signal between the processor and the device under test in response to the test control signals.

In exemplary embodiments, the processor includes: a first processor comprising a first register; and a second processor comprising a second register. The first processor transfers signals of the first register to the second register within the second processor in response to a first instruction, and transfers signals of the second register within the second processor to the first register in response to a second instruction.

In exemplary embodiments, the first processor or an ARM (Advanced RISC Machine) processor, and the second processor is a co-processor. RISC is an acronym for a reduced instruction set computer.

In exemplary embodiments, the test flag signals are stored in the first register within the first processor and in the second register within the second processor. The test flag signals include a trace start signal.

In exemplary embodiments, the test controller enables a chip selection signal provided to the trace memory in response to the trace start signal, and provides an address to the trace memory in response to a clock signal after the chip selection signal is enabled.

In exemplary embodiments, the trace memory writes a transmission data signal between the device under test and the processor in response to the clock signal, the chip selection signal and the address.

According to exemplary embodiments, the device under test is a cache memory. The cache memory is a multi-way set associative cache memory. The trace memory stores a cache address provided from the processor to the cache memory, and data signals output from sets of the cache memory to the processor.

In exemplary embodiments, the test controller outputs a selection signal for selecting one of the cache address provided from the processor to the cache memory and the data signals output from the sets of the cache memory to the processor. The trace memory stores one of the cache address provided from the processor to the cache memory and the data signals output from the sets of the cache memory in response to the selection signal.

According to exemplary embodiments, the trace memory includes: at least two memories; and a selection circuit providing one of the cache address provided from the processor to the cache memory and the data signals output from the sets of the cache memory to the processor to one of the at least two memories in response to the selection signal.

In exemplary embodiments of the present invention, semiconductor integrated circuits include a device under test; a processor accessing the device under test, and generating test flag signals; a test controller generating test control signals in response to the test flag signals; and a trace memory storing a transmission data signal between the processor and the device under test and providing the stored data signal to the processor in response to the test control signals.

BRIEF DESCRIPTION OF THE FIGURES

Exemplary embodiments of the present invention will be understood in more detail from the following descriptions taken in conjunction with the attached figures.

DETAILED DESCRIPTION OF EXEMPLARY EMBODIMENTS

Exemplary embodiments of the present invention will be described below in more detail with reference to the accompanying drawings.

Figure 1:
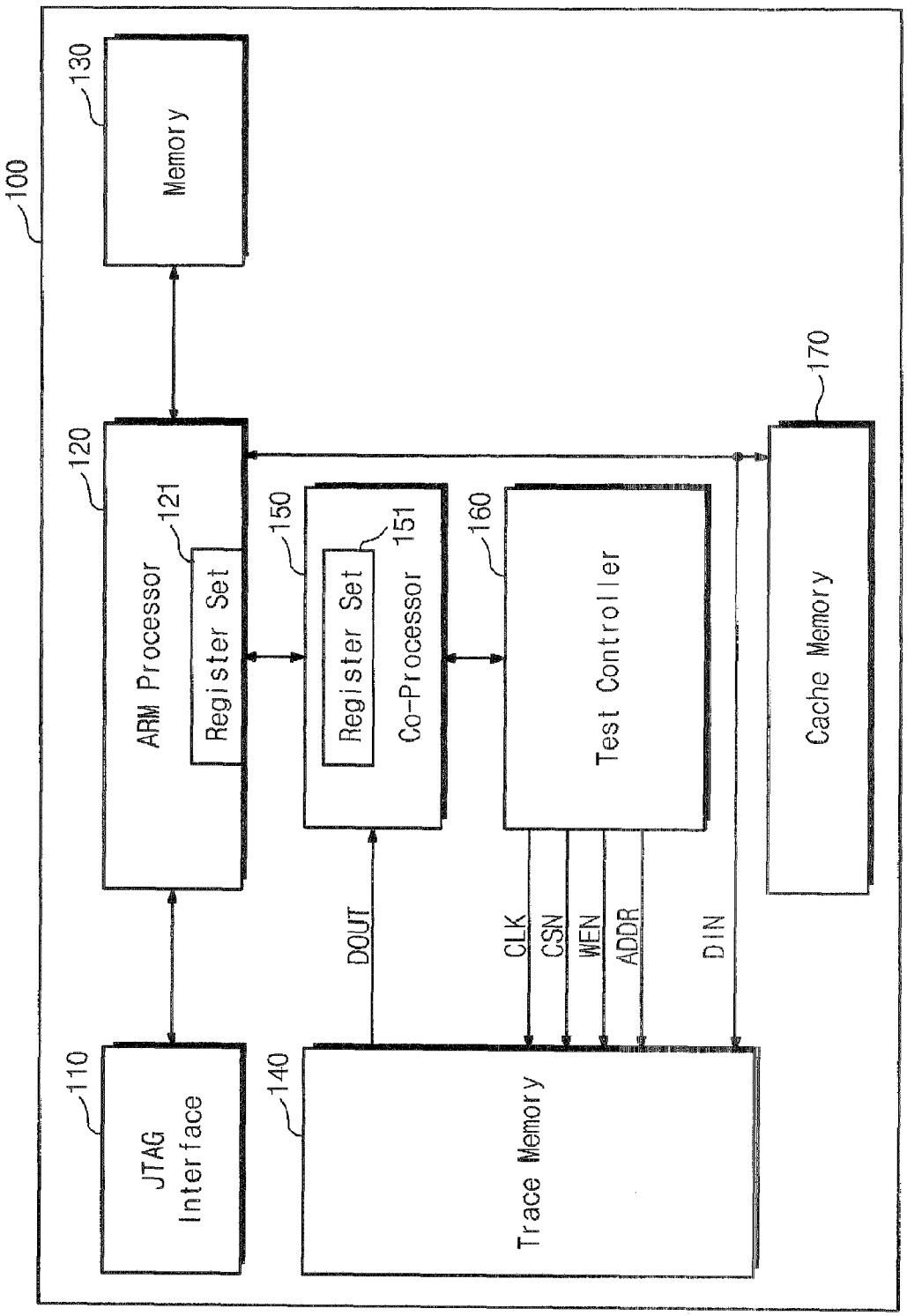
FIG. 1 is a block diagram showing a configuration of a semiconductor integrated circuit according to an exemplary embodiment of the present invention.

FIG. 1 is a block diagram showing a configuration of a semiconductor integrated circuit according to an exemplary embodiment of the present invention. Referring to FIG. 1, a semiconductor integrated circuit 100 includes a joint test action group (JTAG) interface 110 interfacing with the outside, an advanced RISC machine (ARM) processor 120, a memory 130, a trace memory 140, a co-processor 150, a test controller 160, and a cache memory 170.

The ARM processor 120 is the main processor and includes a register set 121. A test program or a test code stored in the memory 130 is executed by the ARM processor 120, and address and flag signals for a test are stored in the register set 121. In an exemplary embodiment, the test program or the test code may be input from the outside through the JTAG interface 110, without being stored in the memory 130.

The co-processor 150 includes a register set 151, and the address and the flag signals for a test, which are stored in the register set 121 within the ARM processor 120, may be transferred to the register set 151 within the co-processor 150. A rest result stored in the register set 151 within the co-processor 150 is transferred to the register set 121 within the ARM processor.

The test controller 160 generates an address (ADDR) and control signals (CLK, CSN, WEN) for controlling the trace memory 140 in response to the address and the flag signals stored in the register set 151 within the co-processor 150.

The trace memory 140 receives and stores data output from the cache memory 170 as input data (DIN) and provides the stored data to the co-processor 150 as output data (DOUT) in response to the address and the control signals generated by the test controller 160.

The cache memory 170 is a device under test(DUT). That is, when the ARM processor 120 reads data stored in the cache memory 170, the data output from the cache memory 170 is stored in the trace memory 140.

As mentioned above, the integrated circuit 100 according to the present invention includes the test memory 140 of a minimum size for a test, and the test controller 160 configured as a simple control circuit. The data output from the cache memory 170 is stored in the trace memory 140, then is output to the register set 151 of the co-processor 150, and is output to the outside of the integrated circuit 100 through the register set 121 within the ARM processor 120 and the JTAG interface 110. Therefore, even after the integrated circuit 100 is completely manufactured, a test on the cache memory 170 can be easily performed.

Although a cache memory is illustrated and described as one example of a device under test in the exemplary embodiment, the device under test may be any device, provided that the device is integrated with a processor into a single chip.

Figure 2:
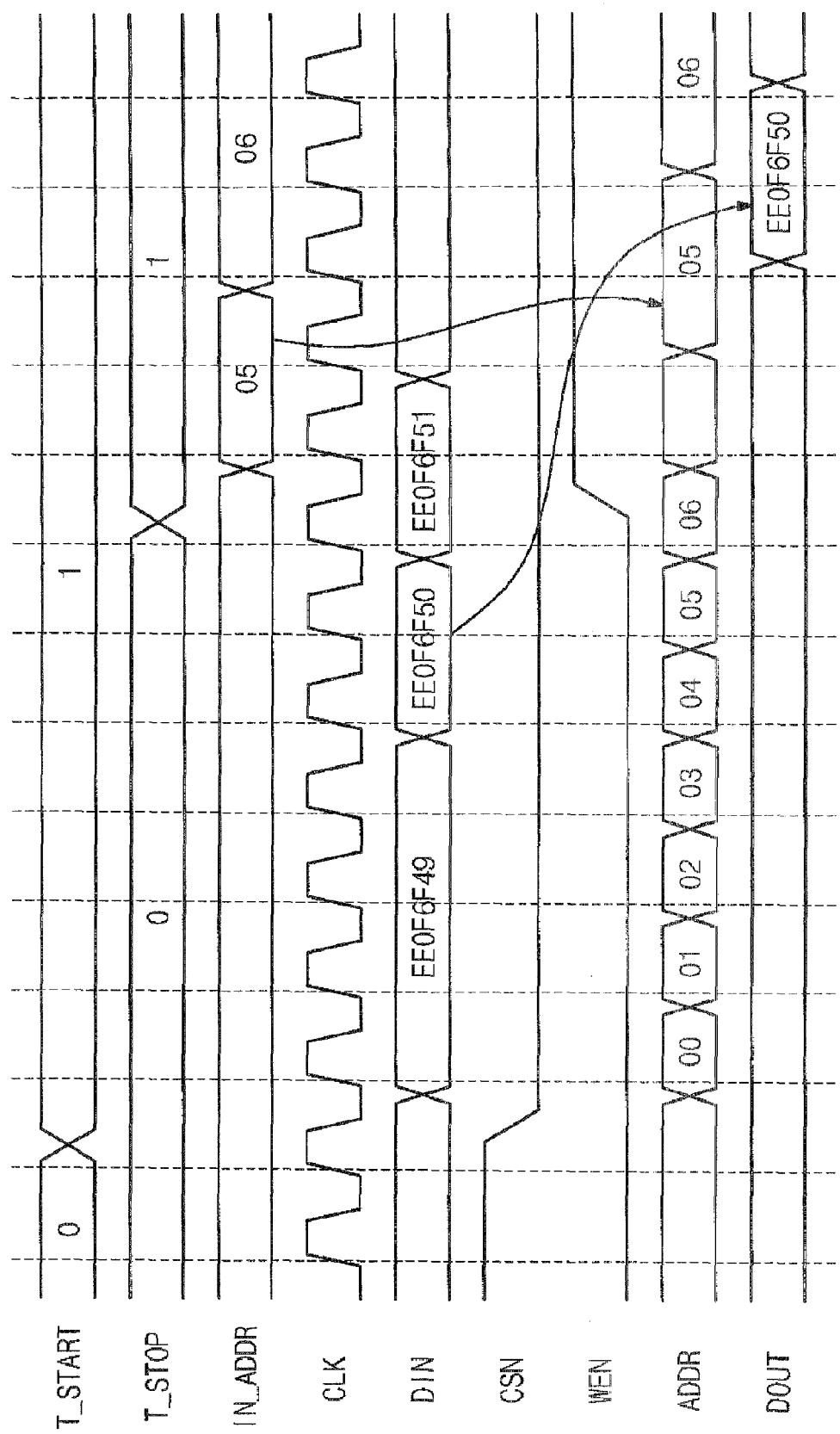
FIG. 2 is a timing diagram showing a process of a test on a cache memory within the integrated circuit illustrated in FIG. 1.

FIG. 2 is a timing diagram showing a process of a test on the cache memory 170 within the integrated circuit 100 illustrated in FIG. 1. The test on the cache memory 170 includes a trace mode of storing data output from the cache memory 170 in the trace memory 140, and a dump mode of outputting data stored in the trace memory 140 to the co-processor 150.

Referring to FIG. 2, the ARM processor 120 executes a test code read from the memory 130, and sets a trace start flag signal T_START of the register set 121 to '1' when the trace mode begins. The Arm processor 120 transfers the trace start flag signal (T_START) stored in the register set 121 to the register set 151 within the co-processor 150 in response to a first instruction. The ARM processor 120 reads data from the cache memory 170.

The test controller 160 sets a chip selection signal CSN to a logic low level in response to the trace start flag signal T_START stored in the register set 151 within the co-processor 150, sets a write enable signal WEN to a logic low level, and sequentially increases an address signal ADDR.

The trace memory 140 stores data DIN output from the cache memory 170 in response to a clock signal CLK, the chip selection signal CSN, the write enable signal WEN, and the address ADDR from the test controller 160.

When a trace stop signal T_STOP transferred from the register set 121 within the ARM processor 120 to the register set 151 within the co-processor 150 is changed from '0' to '1', the test controller 160 changes the write enable signal WEN to a logic high level. Also, an address IN_ADDR transferred from the register set 121 within the ARM processor 120 to the register set 151 within the co-processor 150 is provided to the trace memory 140 as a read address ADDR by the test controller 260.

The trace memory 140 finishes storing of the data DIN input from the cache memory 170 in response to the write enable signal WEN, and outputs data stored in the input address to the register set 151 within the co-processor 150. The ARM processor 120 transfers the data stored in the register set 151 within the co-processor 150 to the register set 121 within the ARM processor 120 in response to a second instruction. Thereafter, data stored in the register set 121 within the ARM processor 120 is output to the outside through the JTAG interface 110.

In the exemplary embodiment, the data DIN input from the cache memory 170 is stored from the $0^{th}$ address of the trace memory 140, and data stored in the trace memory 140 may be read from an address set by the ARM processor 120. Therefore, only the desired data need be read during a test operation, and reading every data stored in the trace memory 140 is not necessary.

Figure 3:
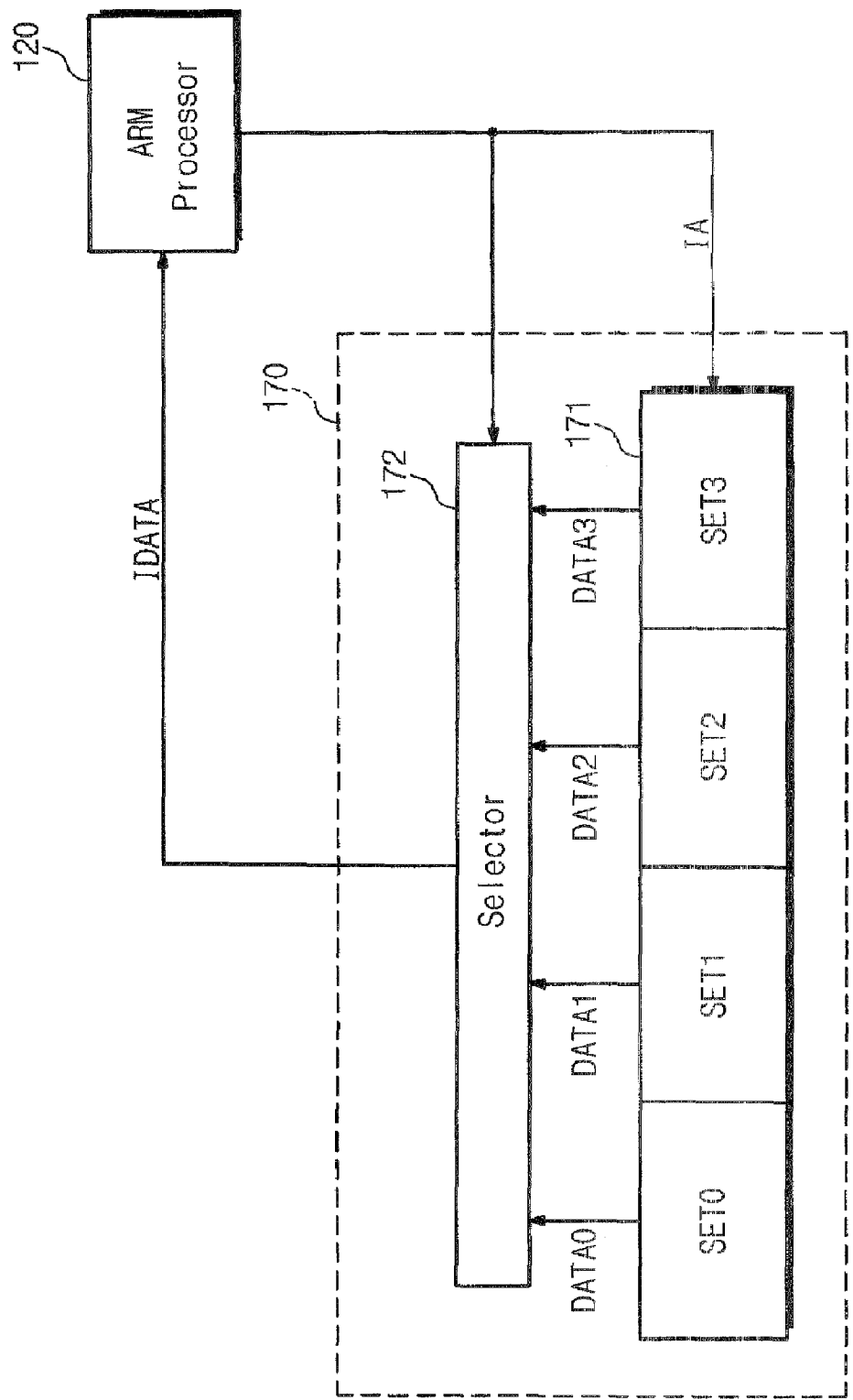
FIG. 3 is a schematic view showing a structure of the cache memory of FIG. 1, which is configured as a multi-way set associative cache memory.

FIG. 3 is a schematic view showing a structure of the cache memory 170 of FIG. 1, which is configured as a multi-way set associative cache memory.

The cache memory 170 illustrated in FIG. 3, includes a four-way set associative cache 171 and a selector 172. In the current embodiment, the associative cache 171 is an instruction cache used to store an instruction, and sets SET0-SET3 of the cache 171 output data DATA0-DATA3 in response to an address IA output from the ARM processor 120. The selector 172 outputs one of data DATA0-DATA3 output from the sets SET0-SET3, respectively, to the ARM processor 120 as output data IDATA in response to the address IA from the ARM processor 120.

The trace memory 140 according to an exemplary embodiment of the present invention may store the address IA output from the ARM processor 120 to the cache memory 170, the data IDATA output from the cache memory 170 to the ARM processor 120, and the data DATA0-DATA3 output from the sets SET0-SET3 of the cache 171.

Figure 4:
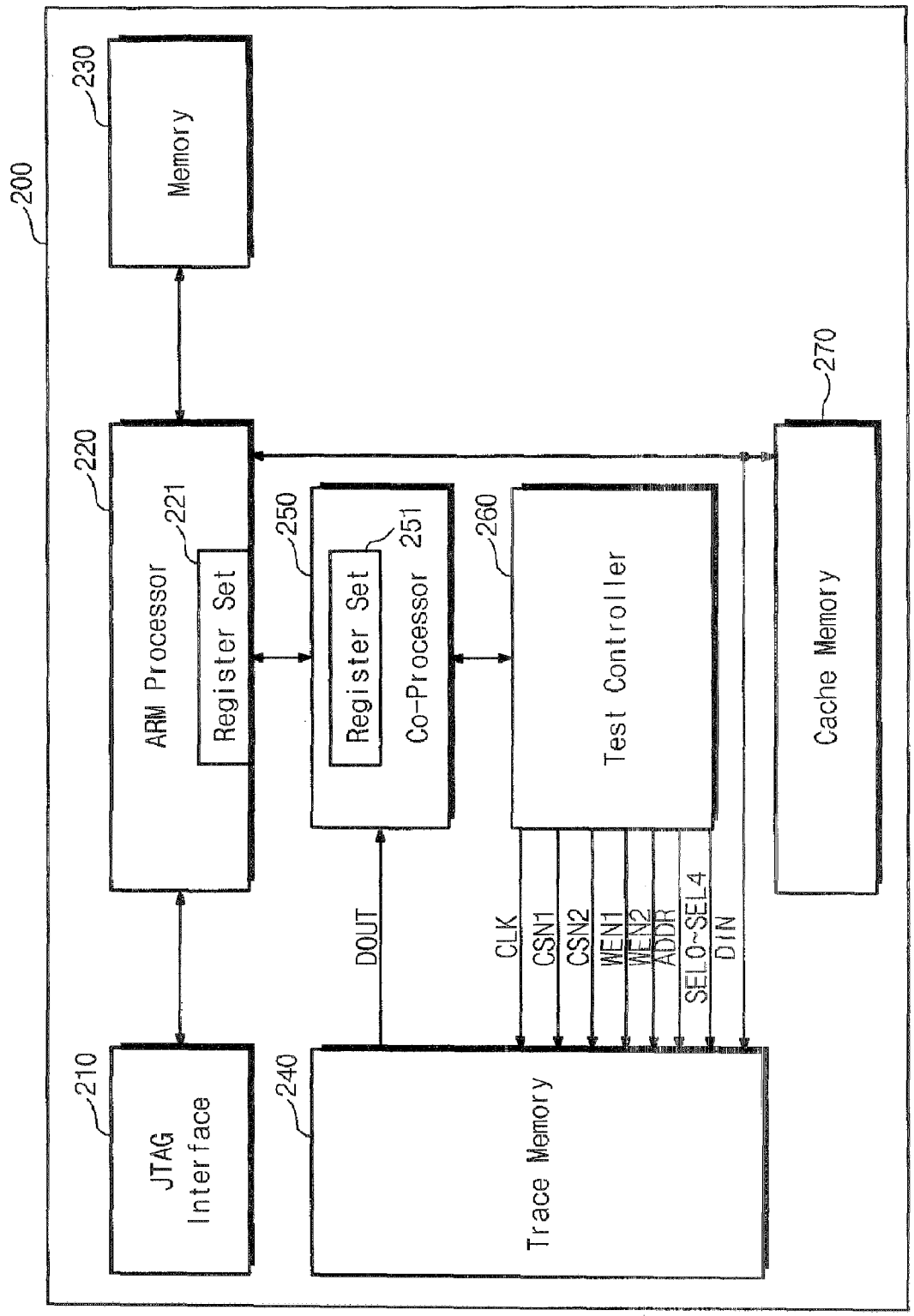
FIG. 4 is a block diagram showing an integrated circuit according to an exemplary embodiment of the present invention.

FIG. 4 is a block diagram showing an integrated circuit according to an exemplary embodiment of the present invention. An integrated circuit 200 illustrated in FIG. 4 has the same circuit configuration as that of the integrated circuit 100 illustrated in FIG. 1, but is different from the integrated circuit 100 in the number of control signals that a test controller 260 provides to a trace memory 240. This difference occurs because the internal circuit configuration of the trace memory 240 is different from the internal circuit configuration of the trace memory 140 illustrated in FIG. 1. A detailed description of circuit parts having the same functions as those of the circuit parts of FIG. 1 will be omitted.

The signals that the test controller 260 provides to the trace memory 240 include a clock signal CLK, first and second chip selection signals CSN1 and CSN2, first and second write enable signals WEN1 and WEN2, an address signal ADDR, and selection signals SEL0-SEL4.

Figure 5:
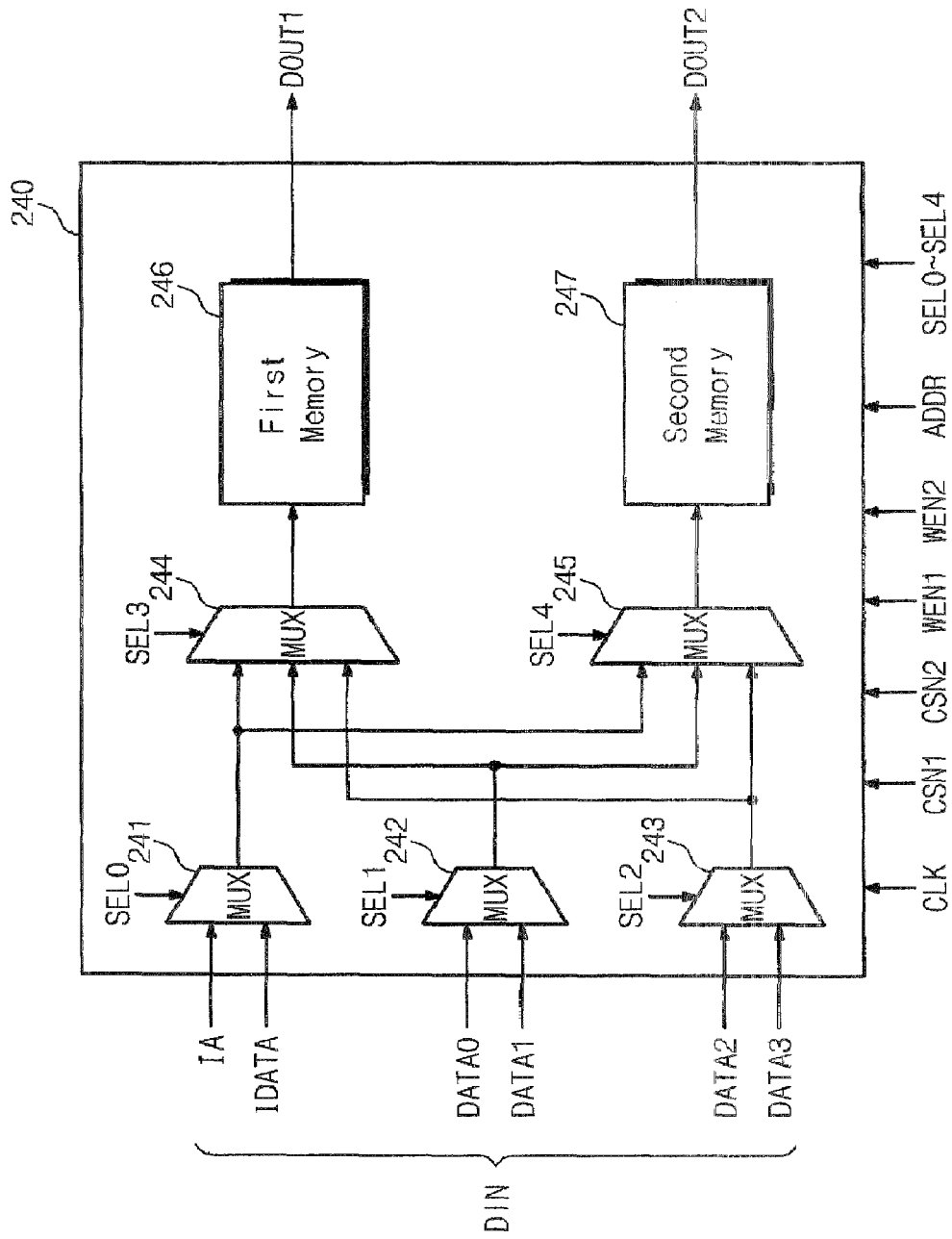
FIG. 5 is a view showing a detailed structure of a trace memory.

A detailed structure of the trace memory 240 is illustrated in FIG. 5. Referring to FIG. 5, the trace memory 240 includes multiplexers 241-245, and first and second memories 246 and 247, respectively. The multiplexer 241 receives an address IA provided from the ARM processor 220 to the cache 171, and data IDATA output from the selector 172. The multiplexer 242 receives data DATA0 and DATA1 output from the sets SET0 and SET1 of the cache (not shown) of the cache memory 270, and the multiplexer 243 receives data DATA2 and DATA3 output from the sets SET2 and SET3 of the cache of the cache memory 270. The multiplexers 244 and 245 each receive all of the outputs from the multiplexers 241-243. Each of the multiplexers 241-245 outputs one of the input signals in response to a corresponding selection signal from among the selection signals SEL0-SEL4 received from the test controller 260.

In order to facilitate tracing of the address IA transferred from the ARM processor 220 to the cache memory 270, and the data IDATA transferred from the cache memory 270 to the ARM processor 220, the trace memory 240 includes two memories 246 and 247. The sizes of the first and second memories 246 and 247 are determined by an area occupied by the memories 246 and 247 within the integrated circuit 200 and the number of instructions stored in the memories 246 and 247. The sizes of the memories 246 and 247 must be set within a range that does not increase the overall size of the integrated circuit 100, and there should be at least ten instructions being traced. In the exemplary embodiment, each of the first and second memories 246 and 247 is configured as 128 word×32 bit static random access memory (SRAM).

The first memory 246 stores inputs from the multiplexer 244 and outputs stored data as output data DOUT1 in response to a clock signal CLK, a chip selection signal CSN, a write enable signal WEN, and an address ADDR input from the test controller 260.

The second memory 247 stores inputs from the multiplexer 245 and outputs stored data as output data DOUT2 in response to a clock signal CLK, a chip selection signal CSN, a write enable signal WEN, and an address ADDR input from the test controller 260.

The selection signals SEL0-SEL4 from the test controller 260 determine which one of the first and second memories 246 and 247 within the trace memory 240 stores data input from the ARM processor 220 and the cache memory 270.

The address IA from the ARM processor 220 and the data DATA0 and DATA2 from the sets SET0 and the SET2 (shown in FIG. 3) of the cache memory 270 are stored sequentially from the 0$^{th}$ address to the 128$^{th}$ address of the first memory 246 and then from the 0$^{th}$ address to the 128$^{th}$ address of the second memory 247. The data IDATA from the cache memory 270 and the data DATA1 and DATA3 from the sets SET1 and SET3 (shown in FIG. 3) of the cache memory 270 are stored sequentially from the 0$^{th}$ address to the 128$^{th}$ address of the second memory 247 and then from the 0$^{th}$ address to the 128$^{th}$ address of the first memory 246.

Figure 6:
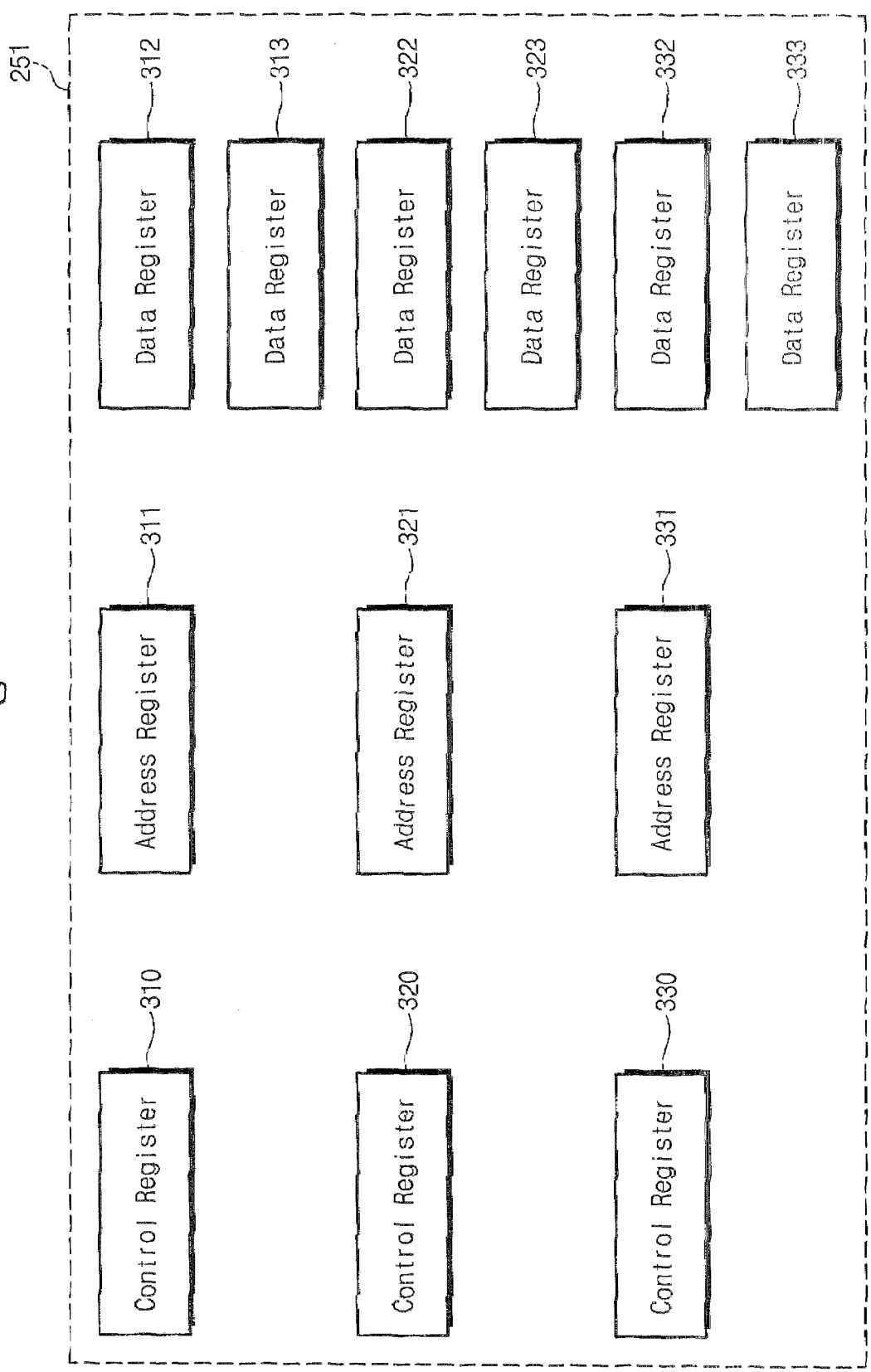
FIG. 6 is an exemplary view of a configuration of a register set within a co-processor illustrated in FIG. 4.

FIG. 6 is an exemplary view showing a configuration of the register set 251 of the co-processor 250 illustrated in FIG. 4. The register set 251 within the co-processor 250 includes control registers 310, 320 and 330, address registers 311, 321 and 331, and data registers 312, 313, 322, 323, 332, and 333.

The control registers 310, 320 and 330 store flag signals described with reference to FIGS. 1 and 2, that is, a trace start signal T_START and a trace stop signal T_STOP. The trace start signal T_START and the trace stop signal T_STOP are signals transferred from the register set 221 within the ARM processor 220.

The address registers 311, 321 and 331 store an address IN_ADDR for reading data stored in the trace memory 240. The address IN_ADDR shown in FIG. 2 is a signal transferred from the register set 221 within the ARM processor 220.

The data registers 312, 313, 322, 323, 332 and 333 store data input to the co-processor 250 from the trace memory 240. The data registers 312, 313, 322, 323, 332 and 333 respectively correspond to input data illustrated in FIG. 5, that is, a cache address IA and data IDATA and DATA0-DATA3.

For example, in a dump mode of reading a cache address IA stored in the trace memory 240, a trace start signal T_START and a trace stop signal T_STOP are stored in the control register 310, a read address is stored in the address register 311, and the cache address IA read from the trace memory 240 is stored in the data register 312.

In an exemplary embodiment, in a dump mode of reading data DATA0 from the set SET0 of the cache of the cache memory 270, which is stored in the trace memory 240, a trace start signal T_START and a trace stop signal T_STOP are stored in the control register 320, a read address is stored in the address register 32, and the data DATA0 read from the trace memory 240 is stored in the data register 322.

The data stored in the data registers 312, 313, 322, 323, 332 and 333 is transferred to the register set 221 within the ARM processor 220 in response to a second instruction. Thereafter, the data stored in the register set 221 within the ARM processor 220 is output to the outside through the JTAG interface 210.

The size and the number of registers included in the register set 251 within the co-processor 250 are not limited to those illustrated in FIG. 6 but may vary. Although flag signals, an address and data are stored in the register set 251 within the co-processor 250 in the exemplary embodiment of the present invention, a test register set may be provided in the integrated circuit 200, or registers within another circuit block may be used. Since extra registers of the register set 251 within the co-processor 250 are used to store the flag signals, the address and the data in the exemplary embodiment, the number of components added in the integrated circuit 200 for a test is minimized.

According to an exemplary embodiment of the present invention, a test on an integrated circuit can be easily performed. More specifically, even after the integrated circuit is completely manufactured, an operation of a device under test, which is configured in the integrated circuit can be tested, without disassembling the integrated circuit.

The above-disclosed exemplary embodiments are to be considered illustrative, and not restrictive, and the appended claims are intended to cover all such modifications, enhancements, and other exemplary embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A semiconductor integrated circuit comprising:
   a device under test;
   a first processor accessing the device under test and generating test flag signals, the first processor having a first register;
   a second processor having a second register;
   a test controller generating test control signals in response to the test flag signals; and a trace memory storing a transmission data signal sent between the first processor and the device under test in response to the test control signals, wherein the first processor transfers signals of the first register to the second register of the second processor in response to a first instruction, the second processor transfers signals of the second register of the second processor to the first register in response to a second instruction, and the test flag signals are stored in the first register of the first processor and in the second register of the second processor.

2. The circuit of claim 1, wherein the first processor is an ARM (Advanced RISC Machine) processor, and the second processor is a co-processor.

3. The circuit of claim 1, wherein the test flag signals include a trace start signal.

4. The circuit of claim 3, wherein the test controller enables a chip selection signal to be provided to the trace memory in response to the trace start signal.

5. The circuit of claim 4, wherein the test controller provides an address to the trace memory in response to a clock signal after the chip selection signal is enabled.

6. The circuit of claim 5, wherein the trace memory records a transmission data signal transmitted between the device under test and the first processor in response to the clock signal, the chip selection signal and an address.

7. The circuit of claim 5, wherein the device under test is a cache memory.

8. The circuit of claim 7, wherein the cache memory is a multi-way set associative cache memory.

9. The circuit of claim 8, wherein the trace memory stores a cache address provided from the first processor to the cache memory, and data signals output from sets of the cache memory to the first processor.

10. The circuit of claim 9, wherein the test controller outputs a selection signal for selecting one of the cache address provided from the first processor to the cache memory and the data signals output from the sets of the cache memory to the first processor; and the trace memory stores one of the cache address provided from the first processor to the cache memory and the data signals output from the sets of the cache memory in response to the selection signal.

11. The circuit of claim 10, wherein the trace memory comprises:

at least two memories; and a selection circuit providing one of the cache address provided from the first processor to the cache memory and the data signals output from the sets of the cache memory to the first processor to one of the at least two memories in response to the selection signal.

12. A semiconductor integrated circuit comprising:

a device under test;

a first processor accessing the device under test and generating test flag signals, the first processor having a first register;

a second processor having a second register;

a test controller generating test control signals in response to the test flag signals; and a trace memory storing a transmission data signal sent between the first processor and the device under test and providing the stored data signal to the second processor in response to the test control signals, wherein the first processor transfers signals of the first register to the second register of the second processor in response to a first instruction, the second processor transfers signals of the second register of the second processor to the first register in response to a second instruction, and the test flag signals are stored in the first register of the first processor and in the second register of the second processor.

13. The circuit of claim 12, wherein the first processor is an ARM (Advanced RISC Machine) processors and the second processor is a co-processor.

14. The circuit of claim 12, wherein the test flag signals include a trace start signal indicating the trace memory to store the transmission data signal between the first processor and the device under test, and a dump start signal indicating the trace memory to provide the stored data signal to the second processor.

15. The circuit of claim 14, wherein the test controller enables a chip selection signal provided to the trace memory in response to the trace start signal.

16. The circuit of claim 15, wherein the test controller provides an address to the trace memory in response to a clock signal after the chip selection signal is enabled.

17. The circuit of claim 14, wherein the test controller disables a write enable signal provided to the trace memory in response to the dump start signal.

18. The circuit of claim 17, wherein the test controller provides an address stored in the second register of the second processor to the trace memory after the write enable signal is disabled.

19. The circuit of claim 12, wherein the device under test is a multi-way set associative cache memory.

20. The circuit of claim 19, wherein the trace memory stores a cache address provided from the first processor to the cache memory and data signals output from sets of the cache memory.

21. The circuit of claim 20, wherein the test controller outputs a selection signal for selecting one of the cache address provided from the first processor to the cache memory and the data signals output from the sets of the cache memory; and the trace memory stores one of the cache address provided from the first processor to the cache memory and the data signals output from the sets of the cache memory in response to the selection signal.

22. The circuit of claim 21, wherein the trace memory comprises:

at least two memories; and a selection circuit providing one of the cache address provided from the first processor to the cache memory and the data signals output from the sets of the cache memory to the first processor to one of the at least two memories in response to the selection signal.

23. The circuit of claim 22, further comprising:

a JTAG (Joint Test Action Group) interface outputting the data signal provided from the trace memory to the second processor.

* * * * *